United States Patent
Abe et al.

(10) Patent No.: US 6,794,921 B2
(45) Date of Patent: Sep. 21, 2004

(54) CLAMP CIRCUIT

(75) Inventors: Hirofumi Abe, Gamagoori (JP);
Hideaki Ishihara, Okazaki (JP);
Shinichi Noda, Okazaki (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/616,426

(22) Filed: Jul. 9, 2003

(65) Prior Publication Data

US 2004/0008070 A1 Jan. 15, 2004

(30) Foreign Application Priority Data

Jul. 11, 2002 (JP) ........................................ 2002-202680

(51) Int. Cl.[7] .............................................. H03K 5/08
(52) U.S. Cl. ...................................... 327/309; 327/321
(58) Field of Search ................................ 327/306, 309, 327/310, 312–315, 317–322, 324–328

(56) References Cited

U.S. PATENT DOCUMENTS

| | | | |
|---|---|---|---|
| 4,849,654 A | | 7/1989 | Okada ......................... 327/545 |
| 5,206,550 A | * | 4/1993 | Mehta .......................... 327/51 |
| 5,479,119 A | | 12/1995 | Tice et al. ..................... 327/74 |
| 5,809,102 A | | 9/1998 | Nakashiba .................... 377/61 |
| 5,898,335 A | * | 4/1999 | Miyamoto et al. ........... 327/535 |
| 6,034,854 A | | 3/2000 | Suga ............................. 361/56 |
| 6,614,282 B2 | * | 9/2003 | Abe et al. ..................... 327/321 |
| 6,633,193 B1 | * | 10/2003 | Halamik et al. ............. 327/334 |

FOREIGN PATENT DOCUMENTS

| | | |
|---|---|---|
| JP | 57-124464 | 8/1982 |
| JP | 61-24268 | 2/1986 |
| JP | 63-233560 | 9/1988 |
| JP | 4-347922 | 12/1992 |
| JP | 8-172162 | 7/1996 |
| JP | 9-129856 | 5/1997 |
| JP | 9-510790 | 10/1997 |
| JP | 10-98154 | 4/1998 |
| JP | 10-242391 | 9/1998 |
| JP | 2001-86641 | 3/2001 |

\* cited by examiner

*Primary Examiner*—My-Trang Nu Ton
(74) *Attorney, Agent, or Firm*—Harness, Dickey & Pierce, PLC (57) ABSTRACT

In the clamp circuit, the first transistor shifts a target clamp voltage by a gate-source voltage to output the target clamp voltage. The buffer circuit inputs the shifted voltage and output a reference voltage on the inputted shifted voltage. The gate of the second transistor is connected to the output terminal of the buffer circuit. The source of the second transistor is connected to the input terminal of the first transistor. In this structure, the reference voltage is supplied to the gate of the second transistor so that, when a terminal voltage of the input terminal of the IC is not less than a clamp voltage corresponding to the sum of the reference voltage and a threshold voltage of the second transistor, the second transistor turns on, whereby the terminal voltage is clamped to a clamp voltage related to the target clamp voltage.

18 Claims, 5 Drawing Sheets

CLAMP CIRCUIT

BACKGROUND OF THE INVENTION

1. Field of the Invention

The present invention relates to a clamp circuit installed in a semiconductor integrated circuit and configured to clamp a voltage inputted to an input terminal of the semiconductor integrated circuit.

2. Description of the Related Art

Miniaturization of manufacturing process of a large scaled integrated circuit (LSI) has been accelerated in order to make faster the operating rate of the LSI and more compact the chip area thereof in recent years.

The acceleration of miniaturization causes a gate oxide of, for example, a MOS (Metal Oxide Semiconductor) device in the LSI to become increasingly thin so that it is necessary to drop a voltage applied on a gate of the MOS device for securing the lifetime thereof. The thin gate oxide also needs to prevent the applied voltage on the gate from exceeding the supply voltage as much as possible in order to avoid the deterioration of MOS device and the destruction thereof.

Using a voltage down converter to make low the supply voltage of the MOS device is effective in the drop of applied voltage on the gate thereof, and the voltage down converter is applied to an internal logic circuit of the LSI. Adding a clamp circuit between input terminals for external signals of the LSI and internal circuits thereof, or that to an exterior of the LSI is effective in the prevention of applied voltage over the supply voltage.

One of conventional structures of LSIs related to analog clamp circuits, which is applied to an ECU (Electronic Control Unit) of vehicles, is explained with reference to FIG. 5.

Figure 5:
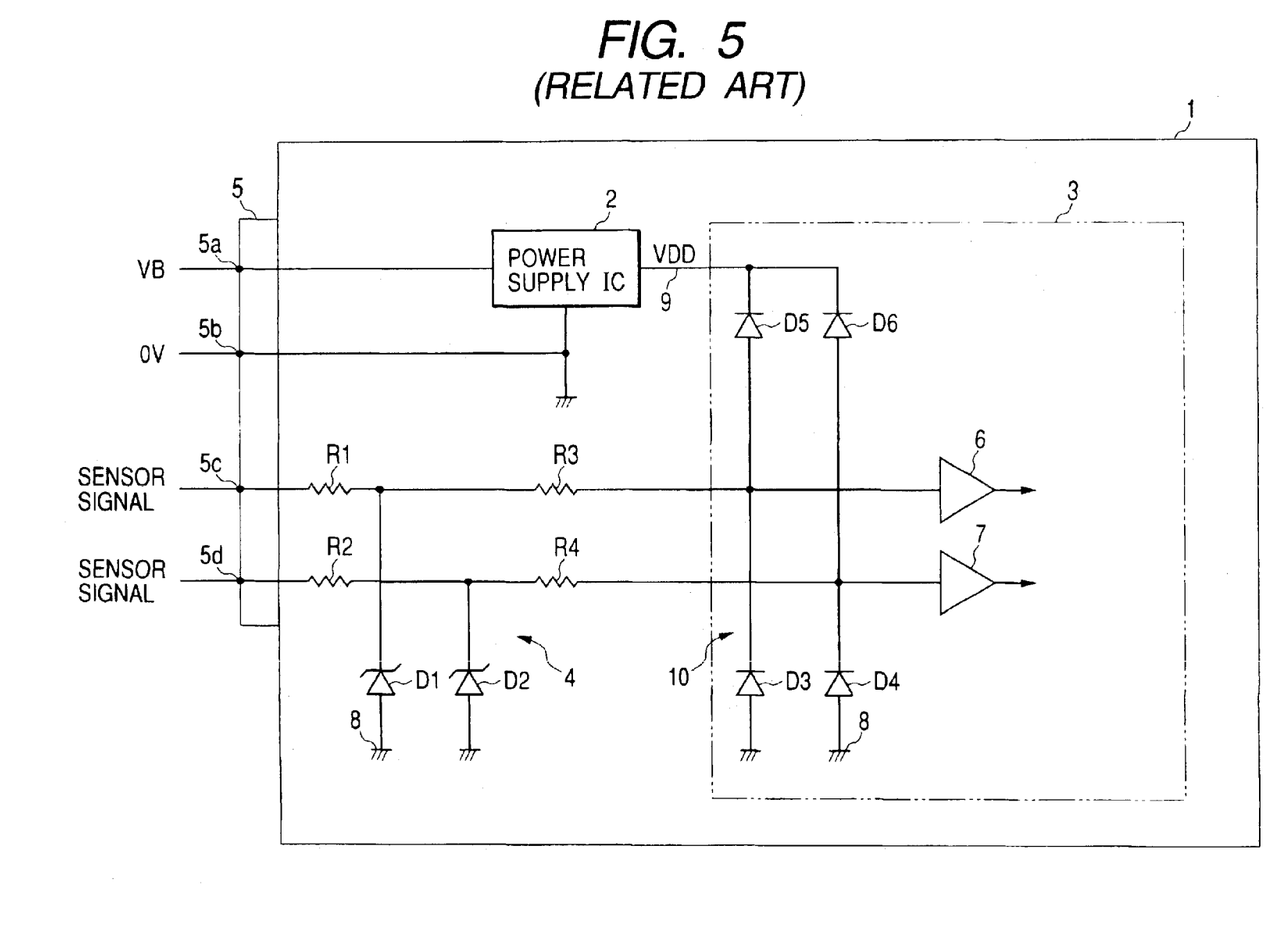
FIG. 5 is an electrical diagram of an LSI of the related art.

In the LSI shown in FIG. 5, a power supply IC (Integrated Circuit) 2 is mounted on a control substrate 1 for outputting a supply voltage $V_{DD}$ of 5V ±5% for control according to an input of battery voltage VB. A control IC 3 is mounted on the control substrate 1 to which a plurality of signals from sensors are inputted. The control IC is operative to perform various controls according to the inputted sensor signals.

A clamp circuit 4 is mounted on the control substrate 1 to be disposed to an exterior of the control IC 3.

Each of the sensor signals inputted from a connector 5 has a usually range from 0V to 5V. However, one part of terminals of the connector 5 provided for detecting whether or not signals are inputted thereto, or another part thereof connected to a faulty sensor may be subjected to the battery voltage VB up to approximately 16V.

Respective sensor signals inputted from terminals 5c and 5d are inputted through resistors R1, R3 and R2, R4 to buffer circuits 6 and 7 inside of the control IC 3. The sensor signals outputted from the buffer circuits 6 and 7 are further inputted to channels of an analog/digital converter (A/D converter), respectively.

A zener diode D1 is connected between a common connection point of the resistors R1, R3 and a grand line 8 at the exterior of the control IC 3, and a zener diode D2 is connected between a common connection point of the resistors R2, R4 and the grand line 8 at the exterior of the control IC 3. The zener diodes D1 and D2 provide the clamp circuit 4 and have zener voltages of 5.3 V, respectively.

Each of diodes D3, D4 is connected between each of input terminals of each of the buffer circuits 6, 7 and the grand line 8. Each of diodes D5, D6 is connected between each of input terminals of each of the buffer circuits 6, 7 and a control voltage line 9. These diodes D3 to D6 provide a clamp circuit 10 inside of the control IC 3.

In this structure, input voltages of the input signals to the buffer circuits 6, 7 are regulated in the range from −VF of approximately −0.5 V to 5.3 V independent of the level of each of the input signals thereto.

Process, therefore, for MOS devices each having high-withstand voltage of 5V+10 %, such as 5.5 V and low-withstand voltage of −10%, such as −0.5 V, that is, process for low-withstand devices can be adopted to manufacture the internal circuits including the buffer circuits 6, 7.

However, in cases where a large number of sensor signals are inputted to the control IC 3, zener diodes must be required with respect to the sensor signals, respectively, causing the area of the control substrate 1 to increase and the cost of the clamp circuits to rise.

In contrast, when removing the zener diodes D1, D2 from the clamp circuit 4, the regulation voltage of high-voltage side of the input signal becomes 5.25 V+VF, which equals to an approximately little less than 6 V, in accordance with voltage variation of 5 V±5% of the supply voltage $V_{DD}$.

In this case, even when adopting the low-withstand device process with respect to the buffer circuits 6, 7, MOS devices of the buffer circuits 6, 7 are not immediately broken down, but hot carriers or slow traps are graduately generated in the MOS devices of the buffer circuits 6, 7 so that the generated hot carries or slow traps cause the threshold voltages to vary, finally making the MOS devices deviate from these original electric specs.

In order to avoid the generation of the hot carriers or the slow traps, process for MOS devices each having high-withstand voltage of 6V, in other words, process for high-withstand devices, must be adopted to manufacture the signal input portion of the LSI, causing the cost of manufacturing the LSI due to an addition of the process for high-withstand devices to be increased, and the operating rate thereof to be decreased.

Each of the clamp circuits 4 and 10 shown in FIG. 5 has a characteristic of comparatively large variation of each of the clamp voltages due to temperature changes so that, when adopting the clamp circuits 4 and 10 to an ECU for vehicles which is utilized in environments in which large temperature changes occur, it is hard to get sufficient accuracy of clamp voltages of the claim circuits 4 and 10.

SUMMARY OF THE INVENTION

The invention is made on the background of the need of the related arts.

Accordingly, it is an object of the invention to provide a clamp circuit installed in a semiconductor integrated circuit, which is capable of omitting external elements required for the operations of the clamp circuit as much as possible, and making decrease the clamp voltage variation due to temperature changes.

In order to achieve the object, according to one aspect of the present invention, there is provided a clamp circuit integrated in a semiconductor integrated circuit with an input terminal and configured to clamp a voltage inputted to the input terminal of the semiconductor integrated circuit, the clamp circuit comprising: a first transistor having a gate, a source, a drain connected to the gate and a conductivity type, the first transistor being configured to shift a target clamp voltage applied on the source by a gate-source voltage to output the shifted target clamp voltage, the gate-source voltage representing a voltage between the gate and the source of the first transistor; a buffer circuit having an output terminal and connected to the first transistor, the buffer circuit being configured to input the shifted voltage outputted from the first transistor and output a reference voltage according to the inputted shifted voltage; and a second transistor having a gate, a source, a drain and a conductivity type which is the same as the conductivity type of the first transistor, the gate being connected to the output terminal of the buffer circuit, the source being connected to the input terminal of the first transistor.

In order to achieve the object, according to another aspect of the present invention, there is provided a clamp circuit integrated in a semiconductor integrated circuit with an input terminal and configured to clamp a voltage inputted to the input terminal of the semiconductor integrated circuit, the clamp circuit comprising: a first transistor having a base, an emitter, a collector connected to the base and a type of junction, the first transistor being configured to shift a target clamp voltage applied on the emitter by a base-emitter voltage to output the shifted target clamp voltage, the base-emitter voltage representing a voltage between the base and the emitter of the first transistor; a buffer circuit having an output terminal and connected to the first transistor, the buffer circuit being configured to input the shifted voltage outputted from the first transistor and output a reference voltage according to the inputted shifted voltage; and a second transistor having a base, an emitter, a collector and a type of junction which is the same as the type of junction of the first transistor, the base being connected to the output terminal of the buffer circuit, the emitter being connected to the input terminal of the first transistor.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the invention will be described hereinafter with reference to the accompanying drawings.

(First embodiment)

Figure 1:
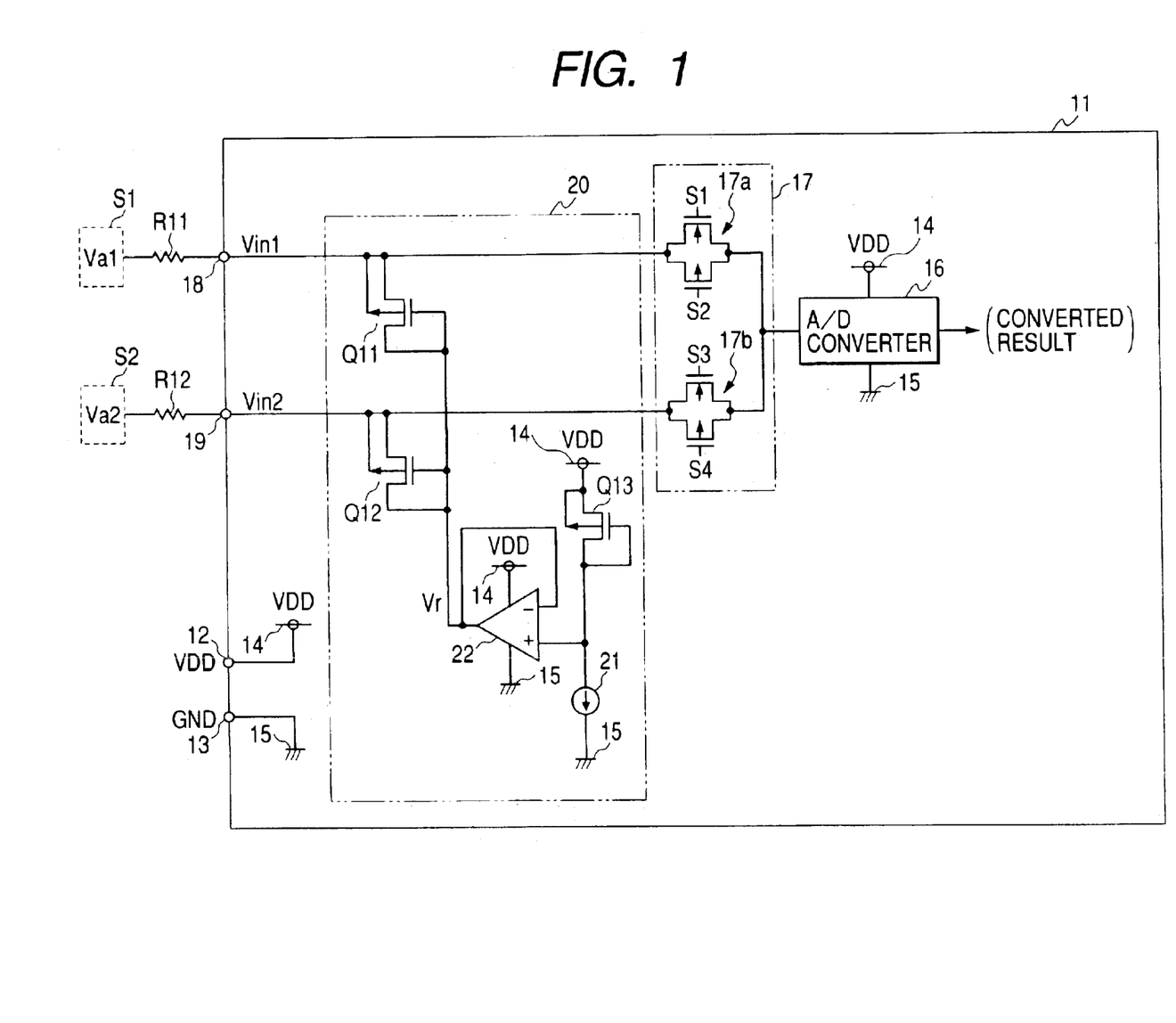
FIG. 1 is an electrical diagram of a semiconductor integrated circuit related to a first embodiment of the present invention.

FIG. 1 illustrates an electrical diagram of a semiconductor integrated circuit related to a first embodiment of the invention and having positive overvoltage protection function. Incidentally, in this first embodiment, the semiconductor integrated circuit is applied to an electric control unit (ECU) installed in a vehicle.

In FIG. 1, a semiconductor integrated circuit 11 which can be manufactured by CMOS process, referred to simply as "IC 11", is provided with terminals 12 and 13 and operates according to the feed of supply voltage $V_{DD}$ of, for example, 5.0 V from an exterior thereof through the terminals 12 and 13. The terminals 12 and 13 are connected to a high-voltage power supply line 14 and a low-voltage power supply line 15, such as grand line, inside of the IC 11, respectively.

The IC 11 comprises an analog/ digital converter (A/D converter) 16, a multiplexer 17 and other kinds of analog and digital circuits. The IC 11 also comprises input terminals 18 and 19 for inputting analog signals from the exterior thereof. When the supply voltage $V_{DD}$ is set to 5.0 V, the maximum rating voltage of each of the input terminals 18 and 19 is set to 5.5 V so that the IC 11 comprises a clamp circuit 20 for regulating each voltage inputted from each of the input terminals 18 and 19 to not more than a predetermined clamp voltage $V_{CL}$ which is previously determined in the range from 5.0 V to 5.5 V. In this embodiment, the clamp voltage $V_{CL}$ is set to a target clamp voltage of 5.0 V corresponding to the supply voltage $V_{DD}$.

The multiplexer 17 comprises analog switches 17a and 17b. The analog switch 17a is connected between the input terminal 18 and an input terminal of the A/D converter 16 and the analog switch 17b is connected between the input terminal 19 and the input terminal of the A/D converter 16. Selection signals S1 to S4 inputted to the multiplexer 17 control it to turn on one of the analog switches 17a and 17b and other off.

The A/D converter 16 is operative to perform, with a predetermined resolution, analog/digital (A/D) conversion of a voltage ranging from 0.0 V to 5.0 V inputted from the multiplexer 17 to output the converted result.

The clamp circuit 20 is provided with a P-conductivity type transistor Q11 (P channel transistor) corresponding to a second transistor and connected at its gate to the input terminal 18, and a P channel transistor Q12 corresponding to a second transistor and connected to at its gate to the input terminal 19.

The clamp circuit 20 is also provided with a transistor Q13 corresponding to a first transistor and having the same conductivity type of the transistors Q11 and Q12. That is, the transistor Q13 is configured as P channel transistor Q13 common to the P channel transistors Q11 and Q12.

The clamp circuit 20 further comprises a constant current circuit 21 and an operational amplifier 22 corresponding to a buffer circuit. Each of the transistors Q11, Q12 and Q13 is formed to have the same size, and each substrate voltage of each of the transistors Q11–Q13 is set to be equal to each source voltage thereof.

Each of the transistors Q11, Q12 and Q13 has the same connection structure regarding each drain, source, gate and back gate.

The source of transistor Q13 is connected to the power supply line 14. The drain and gate of transistor Q13 are directly commonly connected to each other, and further connected to a non-reverse input terminal of the operational amplifier 22. The drain and gate of transistor Q13 are further connected to the power supply line (grand line) 15 through the constant current circuit 21. The operational amplifier 22 is configured as, for example, a voltage follower so that its reverse input terminal is connected to its output terminal and its gain is set to 1. The operational amplifier 22 operates according to the supply of power from the power supply lines 14 and 15.

The source of transistor Q11 is connected to the input terminal 18, and the drain and the gate thereof are directly commonly connected to each other, and further connected to the output terminal of the operational amplifier 22.

The source of transistor Q12 is connected to the input terminal 19, and the drain and the gate thereof are directly commonly connected to each other, and further connected to the output terminal of the operational amplifier 22.

In addition, detection units, such as sensors S1 and S2, are located at the exterior of the IC 11. When the IC 11 is mounted on a substrate, the sensors S1 and S2 are mounted at the exterior of the IC 11 on the substrate. The sensors S1 and S2 output analog voltages Va1 and Va2, respectively.

A resister R11 corresponding to a current regulating element is provided in the signal path between the sensor S1 and the input terminal 18 and mounted at the exterior of the IC 11 on the substrate. A resister R12 corresponding to a current regulating element is provided in the signal path between the sensor S2 and the input terminal 19 and mounted at the exterior of the IC 11 on the substrate.

Next, overvoltage protection operations to the input terminal 18 will be described hereinafter. These overvoltage protection operations are the same to the input terminal 19.

The source of transistor Q13 is connected to the power supply line 14 and the drain thereof is connected to the non-reverse input terminal of the operational amplifier 22 so that, when the constant current outputted from the constant current circuit 21 flows in the transistor Q13, the drain voltage $V_D(Q13)$ of transistor Q13 and the reference voltage Vr outputted from the operational amplifier 22 are represented by the following equation (1):

$$Vr = V_D(Q13) = V_{DD} - V_{GS}(Q13) \tag{1}$$

Where the reference $V_{GS}(Q13)$ represents the absolute value of voltage between the gate and the source of the transistor Q13, referred to simply as gate-source voltage $V_{GS}(Q13)$.

That is, because the gate-source voltage $V_{GS}(Q13)$ depends on the drain current, causing the constant drain current to flow in the transistor Q13 allows the gate-source voltage $V_{GS}(Q13)$ to be constant.

As shown in the equation (1), the transistor Q13 outputs the drain voltage $V_D(Q13)$ corresponding to the voltage of $V_{DD}$—gate-source voltage $V_{GS}(Q13)$ obtained by shifting the supply voltage $V_{DD}$, which corresponds to the target clamp voltage, by the gate-source voltage $V_{GS}(Q13)$.

The outputted drain voltage $V_D(Q13)$ corresponding to the voltage of $V_{DD}$—gate-source voltage $V_{GS}(Q13)$ is inputted to the non-reverse input terminal of the operational amplifier 22 so that the operational amplifier 22 outputs the reference voltage Vr corresponding to the drain voltage $V_D(Q13)$, whereby the reference voltage Vr is applied on the gate of the transistor Q11 as the gate voltage thereof.

At that time, it is assumed that an input voltage Vin1 which satisfies the condition represented by the following equation (2) is inputted to the terminal 18.

$$Vin1 \geq = Vr + Vth(Q11) \tag{2}$$

Where the reference Vth(Q11) represents the absolute value of threshold voltage Vth of the transistor Q11.

As shown in the equation (2), because the input voltage Vin1 is not less than the sum of the gate voltage corresponding to the reference voltage Vr and the threshold voltage Vth(Q11), the transistor Q11 turns on so that the current outputted from the sensor S1 is sank through the resistor R11, the input terminal 18 and the transistor Q11 into the output terminal of the operational amplifier 22.

When the transistor Q11 turns on so that the clamp circuit 20 shifts to clamp condition, the current flowing through the resistor R11 and the like into the output terminal of the operational amplifier 22 causes the input voltage Vin1 to drop by the resistor R11 so that the input voltage Vin1 is regulated to the clamp voltage $V_{CL}$ represented by the following equation (3):

$$V_{CL} = Vr + V_{GS}(Q11) \tag{3}$$

Where the reference $V_{GS}(Q11)$ represents the absolute value of voltage between the gate and the source of the transistor Q11, referred to simply as gate-source voltage $V_{GS}(Q11)$.

In addition, substitution of the equation (1) into the equation (3) obtains the following equation (4) representing the clamp voltage $V_{CL}$:

$$V_{CL} = V_{DD} - V_{GS}(Q13) + V_{GS}(Q11) \tag{4}$$

Because each of the transistor Q11 and the transistor Q13 has the same size, and the same connection structure regarding each drain, source, gate and back gate, the threshold voltage Vth(Q11) of transistor Q11 and the threshold voltage Vth(Q13) of transistor Q13 equal to each other, and, while the transistor Q11 is on, the gate-source voltage $V_{GS}(Q11)$ and the gate-source voltage $V_{GS}(Q13)$ substantially equal to each other.

The transistors Q11 and Q13 are integrated in the IC 11 so that they are closely coupled with each other in temperature so that the transistors Q11 and Q13 have very closely temperature characteristics about the threshold voltages and the gate-source voltages.

These configurations and characteristics of the transistors Q11 and Q13 allow the gate-source voltage $V_{GS}(Q11)$ and the gate-source voltage $V_{GS}(Q13)$ to be cancelled, thereby enabling the clamp voltage $V_{CL}$ to be represented by the following equation (5) independently of temperature changes.

$$V_{CL} = V_{DD} \tag{5}$$

That is, it is possible to set the clamp voltage $V_{CL}$ to the target clamp voltage $V_{DD}$.

Incidentally, because the ECU for vehicles on which the IC 11 is installed operates according to the feed of the power supply from a buttery (not shown), in cases where, for example, the sensors S1 and S2 cause failures, the sensors S1 and S2 may output analog voltages Va1 and Va2 which equal to a buttery voltage VB of, for example, approximately 16 V.

Even if these cases occur, the clamp circuit 20 can exactly perform the above clamp operations as long as the condition regarding the current sinking ability Isink of the operational amplifier 22 and represented as the following equation (6) is satisfied:

$$Isink \geq 2 \cdot (VB - V_L)/R \tag{6}$$

Where the reference R represents the resistance of each of the resistors R11 and R12.

In addition, in cases where a number of N input terminals for analog signals including the input terminals 18 and 19 are provided for the IC 11, the condition represented by the following equation (7) is required in place of that represented by the equation (6):

$$Isink \geq N \cdot (VB - V_{CL})/R \tag{7}$$

As described above, because of providing the clamp circuit 20 to the IC 11, only attaching the external resistors R11 and R12 to the respective input terminals 18, 19 of the IC 11 allows the excessive input voltages Vin1, Vin2 to the input terminals 18, 19 to be clamped to the clamp voltage $V_{CL}$. The clamp allows process for high-withstand devices each having high-withstand voltage of 5.5 V to be adopted to manufacture the whole of IC 11 including the signal input portion thereof, and also it permits the mounted area of the external circuit including the external resistors R11 and R12 to be reduced, making it possible to reduce the cost of the IC 11.

In this embodiment, the transistor Q13 for generating the reference voltage Vr and each transistor Q11, 12 serving as a switching circuit which shifts to the clamping operation have the same size, and the same connection structure, respectively, so that the threshold voltage Vth(Q11) of transistor Q11 and the threshold voltage Vth(Q13) of transistor Q13 equal to each other, and the gate-source voltage $V_{GS}(Q11)$ and the gate-source voltage $V_{GS}(Q13)$ substantially equal to each other, allowing the clamp voltage $V_{CL}$ to accurately coincide with the supply voltage $V_{DD}$ (5V), thereby increasing the accuracy of the clamp voltage $V_{CL}$.

The integrated transistors Q11, Q12 and Q13 are closely coupled with each other in temperature so that the transistors Q11, Q12 and Q13 have very closely temperature characteristics, respectively, making small fluctuations of the clamp voltage $V_{CL}$ dependently on temperatures. Therefore, it is preferable to install the IC 11 on in-vehicle units each having wide temperature range.

The IC 11 of the first embodiment has two input terminals 18, 19 for inputting analog signals, but the IC may have a plurality of input terminals for inputting analog signals, which can obtain similar operations and effects of using the IC 11.

In this case of using the IC having a plurality of input terminals, the transistor Q13, the constant current circuit 21 and the operational amplifier 22 are configured to be common in each input terminal so that, even if there are many input terminals in the IC, it is possible to prevent current consumption of the IC from increasing. The clamp circuit 20, therefore, the more the clamp circuit 20 has input terminals, the more significantly effects of decreasing current consumption occur in the clamp circuit 20 as compared with other claim circuits, thereby making the clamp circuit (the IC) suitable for use in in-vehicle ECUs each having many detection signals and operating on the power of battery.

In addition, the clamp circuit 20 always operates so that the clamp circuit is especially suitable for systems each having low current consumption mode, such as standby mode or the like which runs each system with minimal power.

Furthermore, each substrate voltage of each of the transistors Q11, Q12 and Q13 equals to each source voltage thereof so that it is possible to use the gate-source voltage in which no substrate effect appear.

(Second embodiment)

Next, a second embodiment of the invention will be described hereinafter with reference to FIG. 2.

Figure 2:
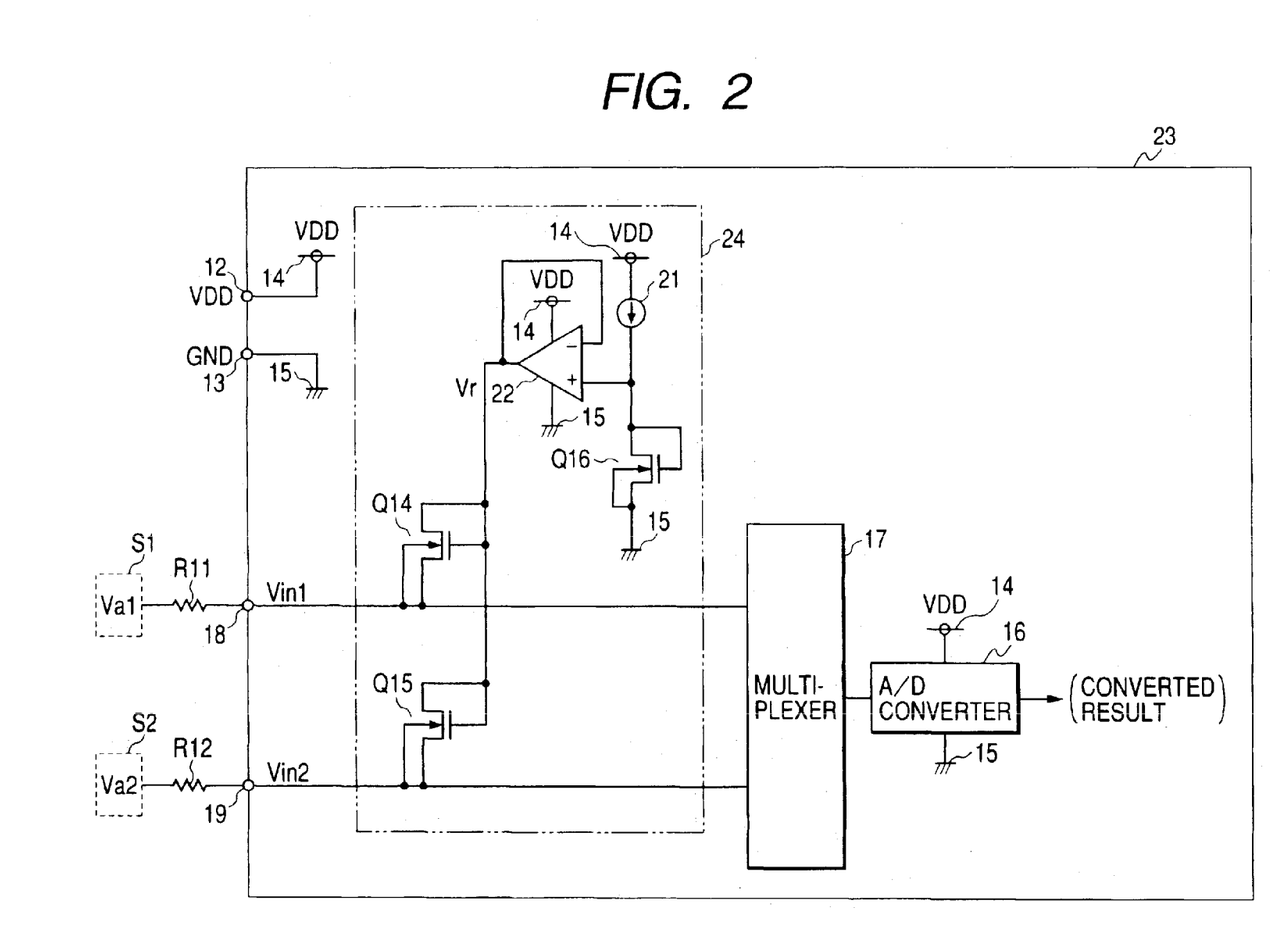
FIG. 2 is an electrical diagram of a semiconductor integrated circuit related to a second embodiment of the present invention.

FIG. 2 illustrates an electrical diagram of a semiconductor integrated circuit 23 related to the second embodiment of the invention and having negative overvoltage protection function.

In FIG. 2, the elements which are the same as those in FIG. 1 are assigned to the same reference characteristics of the elements in FIG. 1.

The semiconductor integrated circuit 23, referred to as "IC 23" is provided with a clamp circuit 24. The clamp circuit 24 comprises N channel transistors Q14, Q15 and Q16 with which the P channel transistors Q11, Q12 and Q13 of the clamp circuit 20 are replaced.

That is, the source of transistor (first transistor) Q16 is connected to the power supply line (grand line) 15. The drain and gate of transistor Q16 are directly commonly connected to each other, and further connected to the non-reverse input terminal of the operational amplifier 22. The drain and gate of transistor Q16 are further connected to the power supply line 14 through the constant current circuit 21.

Each of the transistors Q14, Q15 and Q16 is formed to have the same size, and each substrate voltage of each of the transistors Q11–Q13 is set to be equal to each source voltage thereof.

Each of the transistors Q14, Q15 and Q16 has the same connection structure regarding each drain, source, gate and back gate.

Incidentally, other elements in FIG. 2 are substantially the same of those in FIG. 1 so that explanations of other elements in FIG. 2 are omitted.

Next, overvoltage protection operations to the input terminal 18 will be described hereinafter. These overvoltage protection operations are the same to the input terminal 19.

The drain of transistor Q16 is connected to the non-reverse input terminal of the operational amplifier 22 and the source thereof is connected to the power supply line (grand line) 15 so that, when the constant current outputted from the constant current circuit 21 flows in the transistor Q16, the drain voltage $V_D(Q16)$ of transistor Q16 and the reference voltage Vr outputted from the operational amplifier 22 are represented by the following equation (8):

$$Vr = V_D(Q16) = V_{GS}(Q16) \tag{8}$$

That is, because the gate-source voltage $V_{GS}(Q16)$ depends on the drain current, causing the constant drain current to flow in the transistor Q16 allows the gate-source voltage $V_{GS}(Q16)$ to be constant.

As shown in the equation (8), the transistor Q16 outputs the drain voltage $V_D(Q16)$ corresponding to the gate-source voltage $V_{GS}(Q16)$ obtained by shifting the voltage of power supply line (grand line) 15, which corresponds to the target clamp voltage, by the gate-source voltage $V_{GS}(Q16)$.

The outputted drain voltage $V_D(Q16)$ is inputted to the non-reverse input terminal of the operational amplifier 22 so that the operational amplifier 22 outputs the reference voltage Vr corresponding to the drain voltage $V_D(Q16)$, whereby the reference voltage Vr is applied on the gate of the transistor Q14.

It is assumed that an input voltage Vin1 which satisfies the condition represented by the following equation (9) is inputted to the terminal 18.

$$Vin1 \leq =Vr-Vth(Q14) \tag{9}$$

Where the reference Vth(Q14) represents the absolute value of threshold voltage Vth of the transistor Q14.

The equation (9) clearly shows that, because the input voltage Vin1 is not more than the difference between the gate voltage corresponding to the reference voltage Vr and the threshold voltage Vth(Q14), the transistor Q14 turns on so that the current outputted from the output terminal of the operational amplifier 22 flows through the transistor Q14, the input terminal 18 and the resistor R11.

When the transistor Q14 turns on so that the clamp circuit 24 shifts to clamp condition, the current flowing through the resistor R11 and the like outputted from the output terminal of the operational amplifier 22 causes the input voltage Vin1 to drop by the resistor R11 so that the input voltage Vin1 is regulated to the clamp voltage $V_{CL}$ represented by the following equation (10):

$$V_{CL}=Vr-V_{GS}(Q14) \tag{10}$$

Where the reference $V_{GS}(Q14)$ represents the absolute value of voltage between the gate and the source of the transistor Q14, referred to simply as gate-source voltage $V_{GS}(Q14)$.

In addition, substitution of the equation (8) into the equation (10) obtains the following equation (11) representing the clamp voltage $V_{CL}$:

$$V_{CL}=V_{GS}(Q16)-V_{GS}(Q14) \tag{11}$$

Because each of the transistor Q14 and the transistor Q16 has the same size, and the same connection structure regarding each drain, source, gate and back gate, the threshold voltage Vth(Q14) of transistor Q14 and the threshold voltage Vth(Q16) of transistor Q16 equal to each other, and, while the transistor Q14 is on, the gate-source voltage $V_{GS}(Q14)$ and the gate-source voltage $V_{GS}(Q16)$ substantially equal to each other.

The transistors Q14 and Q16 are integrated in the IC 23 so that they are closely coupled with each other in temperature so that the transistors Q14 and Q16 have very closely temperature characteristics about the threshold voltages and the gate-source voltages.

These configurations and characteristics of the transistors Q14 and Q16 allow the clamp voltage $V_{CL}$ to be represented by the following equation (12) independently of temperature changes.

$$V_{CL}=0 \tag{12}$$

That is, the clamp voltage $V_{CL}$ can be set to the target clamp voltage corresponding to the voltage of power supply line (grand line) 15, which is 0V.

As described above, because of providing the clamp circuit 24 to the IC 23, only attaching the external resistors R11 and R12 to the respective input terminals 18, 19 of the IC 23 allows the excessive input voltages Vin1, Vin2 to the input terminals 18, 19 to be clamped to the clamp voltage $V_{CL}$ of 0V.

Similarly to the first embodiment, therefore, it is possible to obtain the above effects related to the process for low-withstand devices, the mount area of the external circuit R11, R12, the accuracy of the clamp voltage $V_{CL}$ which accurately coincides with the voltage of power supply line 15, the temperature characteristics and the current consumption.

(Third embodiment)

Next, a third embodiment of the invention will be described hereinafter with reference to FIG. 3.

Figure 3:
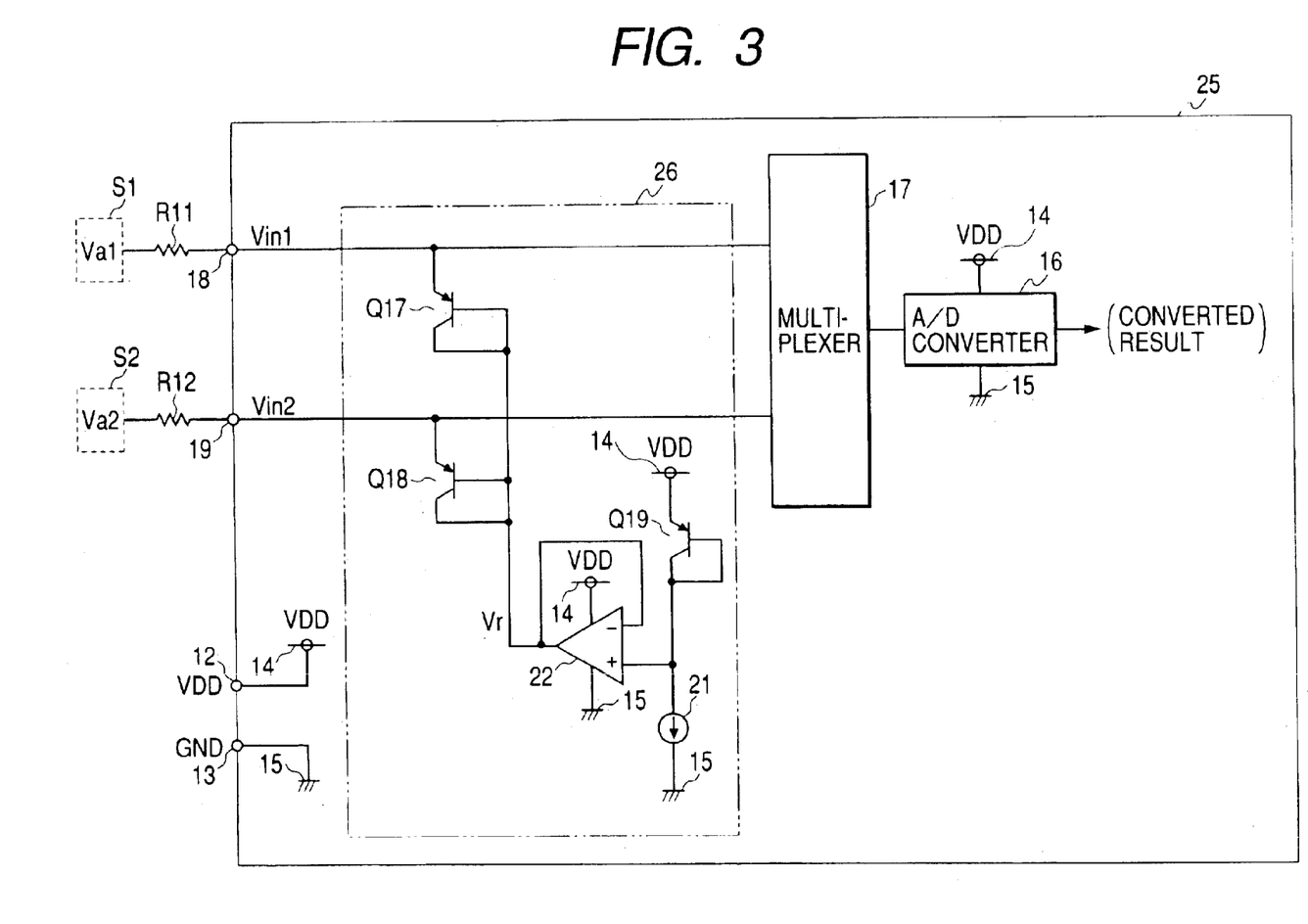
FIG. 3 is an electrical diagram of a semiconductor integrated circuit related to a third embodiment of the present invention.

FIG. 3 illustrates an electrical diagram of a semiconductor integrated circuit 25 related to the third embodiment of the invention and having positive overvoltage protection function.

In FIG. 3, the elements which are the same as those in FIG. 1 are assigned to the same reference characteristics of the elements in FIG. 1.

The semiconductor integrated circuit 25, referred to as "IC 25" is provided with a clamp circuit 26. The clamp circuit 26 comprises a first transistor Q19 and second transistors Q17 and Q18 each having the same type of junction. That is, the first transistor Q19 and second transistors Q17 and Q18 are configured as PNP bipolar transistors, respectively. The base of each of the bipolar transistors Q17, Q18 and Q19 is connected to the collector thereof so that each of the bipolar transistors Q17, Q18 and Q19 has the same connection structure of diodes.

Each of the bipolar transistors Q17, Q18 and Q19 is formed to have the same size.

The emitter of transistor Q19 is connected to the power supply line 14. The collector and base of transistor Q19 are connected to the non-reverse input terminal of the operational amplifier 22. The collector and base of transistor Q19 are connected to the power supply line (grand line) 15 through the constant current circuit 21.

The emitter of transistor Q17 is connected to the input terminal 18, and the collector and base thereof are connected to the output terminal of the operational amplifier 22.

The emitter of transistor Q18 is connected to the input terminal 19, and the collector and base thereof are connected to the output terminal of the operational amplifier 22.

Incidentally, other elements in FIG. 3 are substantially the same of those in FIG. 1 so that they are assigned to the same reference characteristics of the elements in FIG. 1, omitting explanations of other elements in FIG. 3. Incidentally, the constant current circuit 21 and the operational amplifier 22 can configured as bipolar transistors.

Next, overvoltage protection operations to the input terminal 18 will be described hereinafter. These overvoltage protection operations are the same to the input terminal 19.

The emitter of transistor Q19 is connected to the power supply line 14 and the collector thereof is connected to the non-reverse input terminal of the operational amplifier 22 so that, when the constant current outputted from the constant current circuit 21 flows in the transistor Q19, the collector voltage $V_c(Q19)$ of transistor Q19 and the reference voltage Vr outputted from the operational amplifier 22 are represented by the following equation (13):

$$Vr=V_C(Q19)=V_{DD}-V_{BE}(Q19) \tag{13}$$

Where the reference $V_{BE}(Q19)$ represents the absolute value of voltage between the base and the emitter of the transistor Q19, referred to simply as base-emitter voltage $V_{BE}(Q19)$.

That is, because the base-emitter voltage $V_{BE}(Q19)$ depends on the collector current, causing the constant collector current to flow in the transistor Q19 allows the base-emitter voltage $V_{BE}(Q19)$ to be constant.

As shown in the equation (13), the transistor Q19 outputs the collector voltage $V_c(Q19)$ corresponding to the voltage of $V_c$—gate-source voltage $V_{BE}(Q19)$ obtained by shifting the supply voltage $V_{DD}$, which corresponds to the target clamp voltage, by the base-emitter voltage $V_{BE}(Q19)$.

The outputted collector voltage $V_c(Q19)$ corresponding to the voltage of $V_{DD}$—base-emitter voltage $V_{BE}(Q19)$ is inputted to the non-reverse input terminal of the operational amplifier 22 so that the operational amplifier 22 outputs the reference voltage Vr corresponding to the collector voltage $V_c(Q19)$, whereby the reference voltage Vr is applied on the base of the transistor Q17 as the base voltage thereof.

Then, it is assumed that an input voltage Vin1 which satisfies the condition represented by the following equation (14) is inputted to the terminal 18.

$$Vin1 \geq =Vr+V_{BE}(Q17) \tag{14}$$

As shown in the equation (14), because the input voltage Vin1 is not less than the sum of the base voltage corresponding to the reference voltage Vr and the base-emitter voltage $V_{BE}(Q17)$, the transistor Q17 turns on so that the current outputted from the sensor S1 is sank through the resistor R11, the input terminal 18 and the transistor Q17 into the output terminal of the operational amplifier 22.

When the transistor Q17 turns on so that the clamp circuit 25 shifts to clamp condition, the current flowing through the resistor R11 and the like into the output terminal of the operational amplifier 22 causes the input voltage Vin1 to drop by the resistor R11 so that the input voltage Vin1 is regulated to the clamp voltage $V_{CL}$ represented by the following equiaion (15):

$$V_{CL} = Vr + V_{BE}(Q17) \tag{15}$$

Where the reference $V_{BE}(Q17)$ represents the absolute value of voltage between the base and the emitter of the transistor Q17, referred to simply as base-emitter voltage $V_{BE}(Q17)$.

In addition, substitution of the equation (13) into the equation (15) obtains the following equation (16) representing the clamp voltage $V_{CL}$:

$$V_{CL} = V_{DD} - V_{BE}(Q19) + V_{BE}(Q17) \tag{16}$$

Each of the transistor Q17 and the transistor Q19 has the same size, and the transistors Q17 and Q19 have very closely temperature characteristics about the base-emitter voltages so that these configurations and characteristics of the transistors Q17 and Q19 allow the clamp voltage $V_{CL}$ to be represented by the following equation (17) independently of temperature changes.

$$V_{CL} = V_{DD} \tag{17}$$

That is, it is possible to set the clamp voltage $V_{CL}$ to the target clamp voltage $V_{DD}$.

As described above, because of providing the clamp circuit 26 to the IC 25, only attaching the external resistors R11 and R12 to the respective input terminals 18, 19 of the IC 25 allows the excessive input voltages Vin1, Vin2 to the input terminals 18, 19 to be clamped to the clamp voltage $V_{CL}$ which equals to the voltage $V_{DD}$, making it possible to obtain the above effects which are the same obtained in the first embodiment.

(Fourth embodiment)

Next, a fourth embodiment of the invention will be described hereinafter with reference to FIG. 4.

Figure 4:
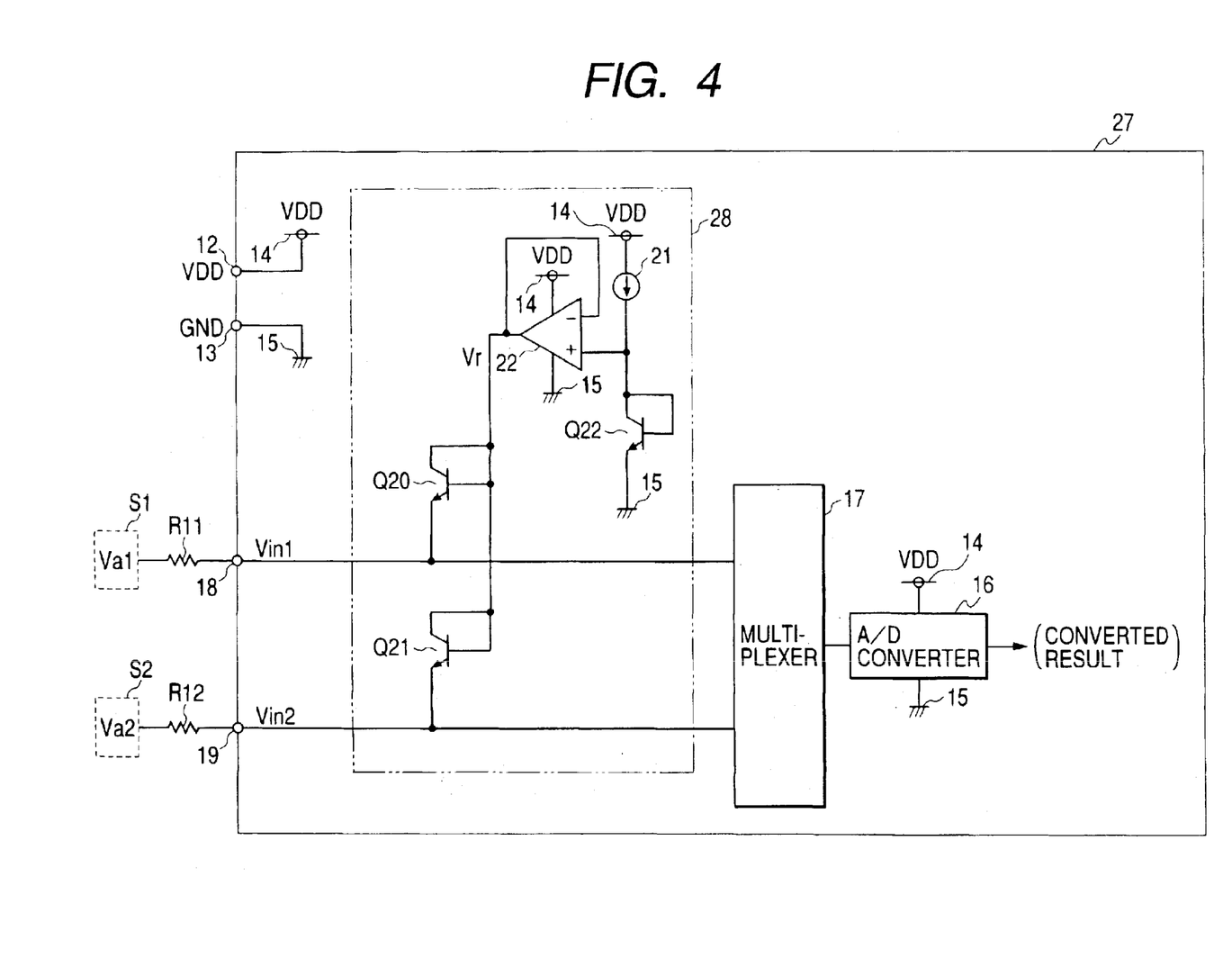
FIG. 4 is an electrical diagram of a semiconductor integrated circuit related to a fourth embodiment of the present invention.

FIG. 4 illustrates an electrical diagram of a semiconductor integrated circuit 27 related to the fourth embodiment of the invention and having negative overvoltage protection function.

In FIG. 4, the elements which are the same as those in FIG. 3 are assigned to the same reference characteristics of the elements in FIG. 3.

The semiconductor integrated circuit 27 (IC 27) is provided with a clamp circuit 28. The clamp circuit 28 comprises NPN transistors Q20, Q21 and Q22 with which the PNP transistors Q17, Q18 and Q19 of the clamp circuit 25 are replaced.

That is, the emitter of transistor (first transistor) Q22 is connected to the power supply line (grand line) 15. The collector and base of transistor Q22 are directly commonly connected to each other, and further connected to the non-reverse input terminal of the operational amplifier 22. The collector and drain of transistor Q22 are further connected to the power supply line 14 through the constant current circuit 21.

The base of each of the bipolar transistors Q20, Q21 and Q22 is connected to the collector thereof so that each of the bipolar transistors Q20, Q21 and Q22 has the same connection structure of diodes.

Each of the transistors Q20, Q21 and Q22 is formed to have the same size,

Incidentally, other elements in FIG. 4 are substantially the same of those in FIG. 1 so that explanations of other elements in FIG. 4 are omitted.

Next, overvoltage protection operations to the input terminal 18 will be described hereinafter. These overvoltage protection operations are the same to the input terminal 19.

The collector of transistor Q22 is connected to the non-reverse input terminal of the operational amplifier 22 and the source thereof is connected to the power supply line (grand line) 15 so that, when the constant current outputted from the constant current circuit 21 flows in the transistor Q22, the collector voltage $V_c(Q22)$ of transistor Q22 and the reference voltage Vr outputted from the operational amplifier 22 are represented by the following equation (18):

$$Vr = V_c(Q22) = V_{BE}(Q22) \tag{18}$$

That is, because the base-emitter voltage $V_{BE}(Q22)$ depends on the collector current, causing the constant collector current to flow in the transistor Q22 allows the base-emitter voltage $V_{BE}(Q22)$ to be constant.

As shown in the equation (18), the transistor Q22 outputs the collector voltage $V_c(Q22)$ corresponding to the base-emitter voltage $V_{BE}(Q22)$ obtained by shifting the voltage of power supply line (grand line) 15, which corresponds to the target clamp voltage, by the base-emitter voltage $V_{BE}(Q22)$.

The outputted collector voltage $V_c(Q22)$ is inputted to the non-reverse input terminal of the operational amplifier 22 so that the operational amplifier 22 outputs the reference voltage Vr corresponding to the collector voltage $V_c(Q22)$, whereby the reference voltage Vr is applied on the base of the transistor Q20.

It is assumed that an input voltage Vin1 which satisfies the condition represented by the following equation (19) is inputted to the terminal 18.

$$Vin1 \leq = Vr - V_{BE}(Q20) \tag{19}$$

The equation (19) clearly shows that, because the input voltage Vin1 is not more than the difference between the base voltage corresponding to the reference voltage Vr and the base-emitter voltage $V_{BE}(Q20)$, the transistor Q20 turns on so that the current outputted from the output terminal of the operational amplifier 22 flows through the transistor Q20, the input terminal 18 and the resistor R11.

When the transistor Q20 turns on so that the clamp circuit 28 shifts to clamp condition, the current flowing through the resistor R11 and the like outputted from the output terminal of the operational amplifier 22 causes the input voltage Vin1 to drop by the resistor R11 so that the input voltage Vin1 is regulated to the clamp voltage $V_{CL}$ represented by the following equation (20):

$$V_{CL} = Vr - V_{BE}(Q20) \tag{20}$$

In addition, substitution of the equation (18) into the equation (20) obtains the following equation (21) representing the clamp voltage $V_{CL}$:

$$V_{CL} = V_{BE}(Q22) - V_{BE}(Q20) \tag{21}$$

Because each of the transistor Q20 and the transistor Q22 has the same size and the transistors Q20 and Q22 have very closely temperature characteristics about the base-emitter voltages so that these configurations and characteristics of the transistors Q20 and Q22 allow the clamp voltage $V_{CL}$ to be represented by the following equation (22) independently of temperature changes.

$$V_{CL}=0 \quad (22)$$

That is, the clamp voltage $V_{CL}$ can be set to the target clamp voltage corresponding to the voltage of power supply line (grand line) 15, which is 0V.

As described above, because of providing the clamp circuit 28 to the IC 27, only attaching the external resistors R11 and R12 to the respective input terminals 18, 19 of the IC 27 allows the excessive input voltages Vin1, Vin2 to the input terminals 18, 19 to be clamped to the clamp voltage $V_{CL}$ of 0V.

Similarly to the first and second embodiments, therefore, it is possible to obtain the above effects related to the process for low-withstand devices, the mount area of the external circuit R11, R12, the accuracy of the clamp voltage $V_{CL}$ which accurately coincides with the voltage of power supply line 15, the temperature characteristics and the current consumption.

(Other embodiments and modifications)

Incidentally, this invention is not limited to each of the first to fourth embodiments described above and shown in FIGS. 1 to 4, and this invention can be modified or enlarged, which will be described hereinafter.

That is, it is possible to provide the clamp circuit 20 related to the first embodiment and the clamp circuit 24 related to the second embodiment to the IC related to this invention. In addition, the IC related to this invention can comprises both of the clamp circuit 26 related to the third embodiment and the clamp circuit 28 related to the fourth embodiment.

The input terminals of the IC related to this invention which are protected by the above clamp operations are not limited to the analog input terminals, but to various kinds of signal input terminals such as general digital ports or the like.

In the first embodiment, the drains of second transistors Q11 and Q12 may be connected to the power supply line 15, and, in the second embodiment, the drains of second transistors Q14 and Q15 may be connected to the power supply line 14. Similarly, in the third embodiment, the collectors of second transistors Q17 and Q18 may be connected to the power supply line 15, and, in the fourth embodiment, the collectors of second transistors Q20 and Q21 may be connected to the power supply line 14.

In the first embodiment, the clamp voltage $V_{CL}$ is set to equal to the supply voltage of $V_{DD}$ supplied to the A/D converter 16. This set may cause error in the input voltage near the voltage $V_{DD}$ due to the clamp operations when the upper limit of the input voltage range to the A/D converter 16 is specified by the voltage $V_{DD}$. In this case, it is preferable to set the clamp voltage $V_{CL}$ of high-voltage side to the voltage which is larger than the supply voltage $V_{DD}$. Specifically, applying the voltage which is larger than the supply voltage $V_{DD}$ on the source of transistor Q13 allows the set of the clamp voltage $V_{CL}$ of high-voltage side to be realized. In addition, setting each of the threshold voltages Vth(Q11) and Vth(Q12) of each of the transistors Q11 and Q12 to the voltage which is larger than the threshold voltage Vth(Q13) of the transistor Q13.

It is effective to make large the size of transistor Q13 as compared with that of each of the transistors Q11 and Q12, or decrease the output current from the constant current circuit 21 when changing each of the threshold voltages Vth(Q11) and Vth(Q12) of each of the transistors Q11 and Q12. In addition, when each of the threshold voltages Vth(Q11) and Vth(Q12) of each of the transistors Q11 and Q12, it is also effective to insert a resistor into the drain or the source of each of the transistor Q11 and Q12, or regulate the operational amplifier so that the operational amplifier has a predetermined offset voltage.

In the second embodiment, when the lower limit of the input voltage range to the A/D converter 16 is specified by the grand level of 0 V, it is preferable to set the clamp voltage $V_{CL}$ of low-voltage side to the voltage which is smaller than the 0 V.

The same is true for each of the third and fourth embodiments.

In each of the first, second, third and fourth embodiments, the first transistor and each of the second transistors have the same sizes, respectively, but, in the invention, the first transistor and each of the second transistors may have different sizes, respectively. In this modification, the difference between the size of the first transistor and that of each second transistor causes a voltage difference between both threshold voltages of the first and second transistors, and that between both gate-source voltages (base-emitter voltages) of the first and second transistors. Using the voltage difference to the offset voltage of the operational amplifier allows the clamp voltage to shift by the difference between both gate-source voltages (base-emitter voltages) of the first and second transistors.

Furthermore, as the buffer circuit, the operational amplifier configured as a voltage follower is used, but another one of operational amplifiers may be used as the buffer circuit, or other circuit having the same function of the operational amplifier may be used.

While there has been described what is at present considered to be the embodiments and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2002-202680 filed on Jul. 11, 2002 so that the contents of which are incorporated herein by reference.

What is claimed is:

1. A clamp circuit integrated in a semiconductor integrated circuit with an input terminal and configured to clamp a voltage inputted to the input terminal of the semiconductor integrated circuit, said clamp circuit comprising:

a first transistor having a gate, a source, a drain connected to the gate and a conductivity type, said first transistor being configured to shift a target clamp voltage applied on the source by a gate-source voltage to output the shifted target clamp voltage, said gate-source voltage representing a voltage between the gate and the source of the first transistor;

a buffer circuit having an output terminal and connected to the first transistor, said buffer circuit being configured to input the shifted target clamp voltage outputted from the first transistor and output a reference voltage according to the inputted shifted voltage; and a second transistor having a gate, a source, a drain and a conductivity type which is the same as the conductivity type of the first transistor, said gate being connected to the output terminal of the buffer circuit, said source being connected to the input terminal.

2. The clamp circuit according to claim 1, wherein said gate and drain of the second transistor are connected to each other.

3. The clamp circuit according to claim 1, wherein said first and second transistors have substrate voltages and source voltages, respectively, and each of said substrate voltages of the first and second transistors is set to substantially equal to each of the source voltages thereof.

4. The clamp circuit according to claim 1, wherein each of said first and second transistors has a same size and a same connection structure regarding each drain, source and back gate.

5. The clamp circuit according to claim 1, wherein said drain and gate of the first transistor is connected to a power supply line of the semiconductor integrated circuit.

6. The clamp circuit according to claim 1, wherein said semiconductor integrated circuit is mounted on a substrate, a current regulating element is connected to the input terminal of the semiconductor integrated circuit and mounted at an exterior thereof on the substrate, and said source of the second transistor is connected to the current regulating element through the input terminal.

7. The clamp circuit according to claim 1, wherein said first and second transistors have different sizes, respectively.

8. The clamp circuit according to claim 1, further comprising a constant current circuit connected to the drain and gate of the first transistor.

9. The clamp circuit according to claim 1, wherein said buffer circuit comprises an operational amplifier having a reverse input terminal, a non-reverse input terminal and an output terminal, and configured as a voltage follower so that the reverse input terminal is connected to the output terminal, and said non-reverse input terminal is connected to the drain and gate of the first transistor.

10. A clamp circuit integrated in a semiconductor integrated circuit with an input terminal and configured to clamp a voltage inputted to the input terminal of the semiconductor integrated circuit, said clamp circuit comprising:

a first transistor having a base, an emitter, a collector connected to the base and a type of junction, said first transistor being configured to shift a target clamp voltage applied on the emitter by a base-emitter voltage to output the shifted target clamp voltage, said base-emitter voltage representing a voltage between the base and the emitter of the first transistor;

a buffer circuit having an output terminal and connected to the first transistor, said buffer circuit being configured to input the shifted target clamp voltage outputted from the first transistor and output a reference voltage according to the inputted shifted voltage; and a second transistor having a base, an emitter, a collector and a type of junction which is the same as the type of junction of the first transistor, said base being connected to the output terminal of the buffer circuit, said emitter being connected to the input terminal.

11. The clamp circuit according to claim 10, wherein said base and collector of the second transistor are connected to each other.

12. The clamp circuit according to claim 10, wherein said first and second transistors have substrate voltages and source voltages, respectively, and each of said substrate voltages of the first and second transistors is set to substantially equal to each of the source voltages thereof.

13. The clamp circuit according to claim 10, wherein each of said first and second transistors has a same size.

14. The clamp circuit according to claim 10, wherein said collector and base of the first transistor is connected to a power supply line of the semiconductor integrated circuit.

15. The clamp circuit according to claim 10, wherein said semiconductor integrated circuit is mounted on a substrate, a current regulating element is connected to the input terminal of the semiconductor integrated circuit and mounted at an exterior thereof on the substrate, and said collector of the second transistor is connected to the current regulating element through the input terminal.

16. The clamp circuit according to claim 10, wherein said first and second transistors have different sizes, respectively.

17. The clamp circuit according to claim 10, further comprising a constant current circuit connected to the collector and base of the first transistor.

18. The clamp circuit according to claim 10, wherein said buffer circuit comprises an operational amplifier having a reverse input terminal, a non-reverse input terminal and an output terminal, and configured as a voltage follower so that the reverse input terminal is connected to the output terminal, and said non-reverse input terminal is connected to the collector and base of the first transistor.

* * * * *